/

US007642184B2

(12) United States Patent
Chang et al.

(10) Patent No.: US 7,642,184 B2
(45) Date of Patent: Jan. 5, 2010

(54) METHOD FOR DUAL DAMASCENE PROCESS

(75) Inventors: Ching-Yu Chang, Yilang County (TW); Jen-Chieh Shih, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 329 days.

(21) Appl. No.: 11/687,093

(22) Filed: Mar. 16, 2007

(65) Prior Publication Data

US 2008/0227287 A1 Sep. 18, 2008

(51) Int. Cl.
*H01L 21/4763* (2006.01)
(52) U.S. Cl. ............... 438/618; 438/697; 438/780; 257/E21.579
(58) Field of Classification Search .......... 438/618, 438/697, 780; 257/E21.579
See application file for complete search history.

(56) References Cited

U.S. PATENT DOCUMENTS

| 6,432,814 B1* | 8/2002 | Steiner et al. ............ 438/624 |
| 6,780,761 B1* | 8/2004 | Wu et al. ................. 438/637 |
| 6,919,276 B2* | 7/2005 | Lee et al. ................ 438/692 |
| 7,183,195 B2* | 2/2007 | Lee et al. ................ 438/622 |
| 7,238,619 B2* | 7/2007 | Zhou et al. .............. 438/696 |
| 7,332,449 B2* | 2/2008 | Wang et al. .............. 438/704 |
| 2005/0245082 A1* | 11/2005 | Perng et al. ............. 438/687 |
| 2006/0199379 A1* | 9/2006 | Yeh et al. ................ 438/638 |
| 2007/0010092 A1* | 1/2007 | Zhou et al. .............. 438/638 |
| 2007/0020944 A1* | 1/2007 | Chae et al. .............. 438/725 |

OTHER PUBLICATIONS

Xiao Li et al., "Double Pre-wet RRC (Reducing Resist Consumption) Process for Deep Ultraviolet Bottom Antireflective Coatings (BARC)", Advances in Resist Technology and Processing XXI, edited by John L. Sturtevant, Proceedings of SPIE vol. 5376 (SPIE, Bellingham, WA 2004), pp. 729-738.

* cited by examiner

*Primary Examiner*—George Fourson
*Assistant Examiner*—John M Parker
(74) *Attorney, Agent, or Firm*—Haynes and Boone, LLP

(57) ABSTRACT

The present disclosure provides a method of dual damascene processing. The method includes providing a substrate having vias formed therein; forming an under-layer in the vias and on the substrate; applying a solvent washing process to the under-layer; forming a silicon contained layer on the under-layer; patterning the silicon contained layer (SCL) to form SCL openings exposing the under-layer within the SCL openings; and etching the substrate and the under-layer within the SCL openings to form trenches.

20 Claims, 10 Drawing Sheets

METHOD FOR DUAL DAMASCENE PROCESS

BACKGROUND

In semiconductor technology, an integrated circuit pattern can be defined on a substrate using a photolithography process. Dual damascene processes are utilized to form multi-layer copper interconnections including vertical interconnection vias and horizontal interconnection metal lines. During a dual damascene process, a plug filling material is employed to fill in the vias and the material is then etched back. However, the etch-back process has a relatively high manufacturing cost.

After the plug filling material has been filled and etched back, a lithography patterning process is performed. Typically, a photoresist layer is coated on the substrate for the patterning process. The photoresist layer can have significant variances in thickness and reflectivity, which degrades controls on exposure depth and critical dimension (CD) of the photoresist. This, in turn, adversely affects the lithography patterning process.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
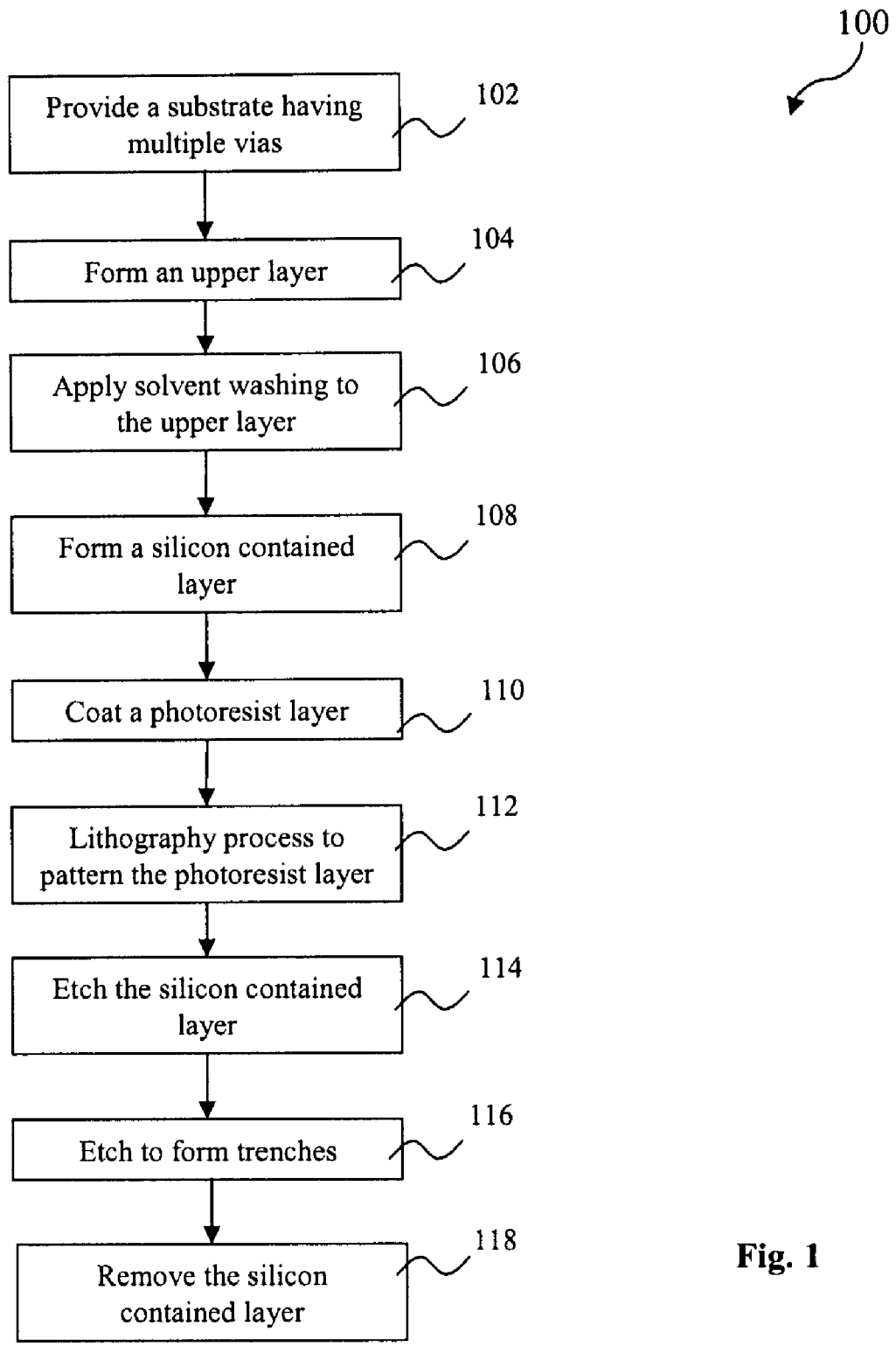
FIG. 1 is a flowchart of one embodiment of a method to form an integrated circuit (IC).

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 to form an integrated circuit according to one or more embodiments of the present invention. FIGS. 2 through 10 illustrate sectional views of an exemplary integrated circuit 200 during various fabrication stages of the method 100. With reference to FIGS. 1 through 10, the method 100 and the exemplary integrated circuit 200 are described below.

Figure 2:
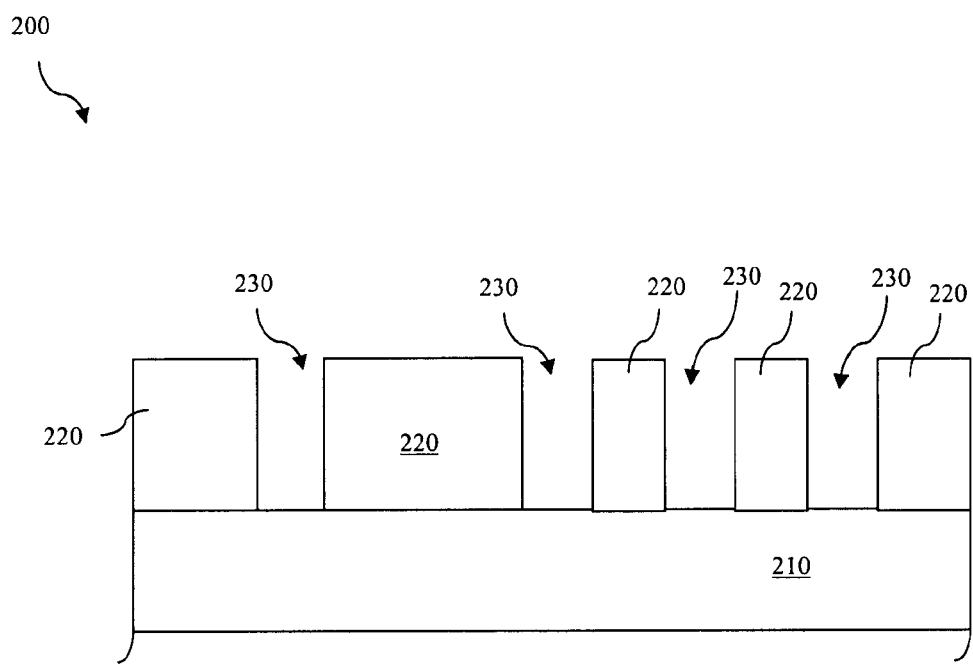
FIGS. 2 through 10 illustrate sectional views of an exemplary integrated circuit during various fabrication stages, made by the method of FIG. 1.

The method begins at step 102 by providing a substrate 210 having a material layer 220 formed thereon and multiple vias 230 formed in the dielectric layer 220, as shown in FIG. 2. The substrate 210 includes silicon. Alternatively, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer. For example, the substrate may have an epitaxial layer overlying a bulk semiconductor. Furthermore, the substrate 210 may include a semiconductor-on-insulator (SOI) structure. For example, the substrate may include a buried oxide (BOX) layer formed by a process such as separation by implanted oxygen (SIMOX). The substrate 210 may include various p-type doped regions and/or an n-type doped regions, implemented by a process such as ion implantation and/or diffusion. The substrate 210 may include other functional features such as a resistor, a capacitor, and a gate structure. The substrate 210 may include lateral isolation features provided to separate various devices formed on the substrate 210. The substrate 210 may further include a plurality of patterned dielectric layers and patterned conductive layers combined to form interconnections configured to couple the various p-type and n-type doped regions and the other functional features. For example, the substrate 210 may include a portion of a multi-layer interconnect (MLI) structure and an inter-level dielectric (ILD) disposed in the MLI structure.

The material layer 220 formed on the substrate 210 includes a dielectric material such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. A process of forming the material layer 220 may utilize chemical vapor deposition (CVD) or a spin-on coating.

The multiple vias 230 are disposed in the material layer 220. The multiple vias 230 may alternatively be trenches for metal lines or contacts for vertical interconnects between doped regions in the semiconductor material of the substrate and the metal lines. The vias 230 may be aligned to expose underlying conductive features in the substrate 210 such as metal features in a lower metal layer or alternatively doped regions disposed in the semiconductor material of the substrate 210. A process of forming the vias 230 may utilize a lithography patterning and etching processes know in the art or by a new technique to be developed in the future.

Figure 3:
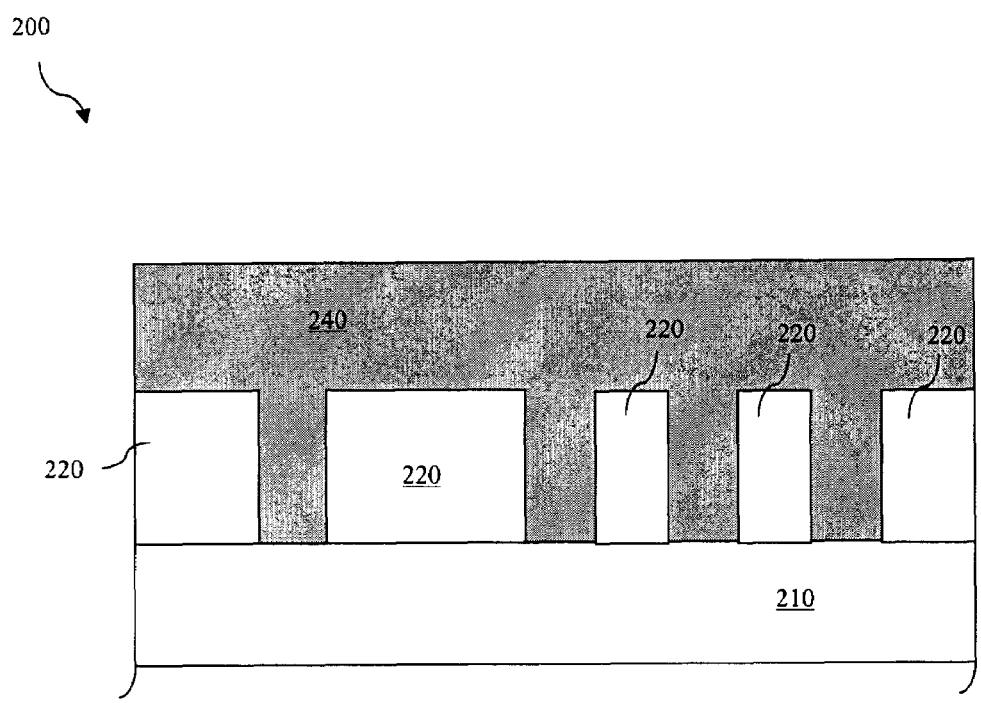

The method 100 proceeds to step 104 by forming an under-layer 240 substantially filled in the vias 230 and additionally disposed above the dielectric layer 220, as shown in FIG. 3. The under-layer 240 is designed to be dissolvable in a solvent. In one example, the under-layer 240 includes a polymeric material. The under-layer 240 includes a carbon rich polymer. For example, the under-layer 240 may include a resist material such as a resist resin material. In the furtherance of the example, the under-layer 240 may include a novolac polymer or poly(4-hydroxy)styrene (PHS) polymer. The under-layer 240 can be formed by a spin-on coating technique or other suitable techniques. A baking process may be additionally applied to the under-layer 240 thereafter. The baking temperature may range between about 200° C. and about 250° C. The under-layer 240 may have a thickness ranging between about 2,000 angstrom and about 10,000 angstrom.

Figure 4:
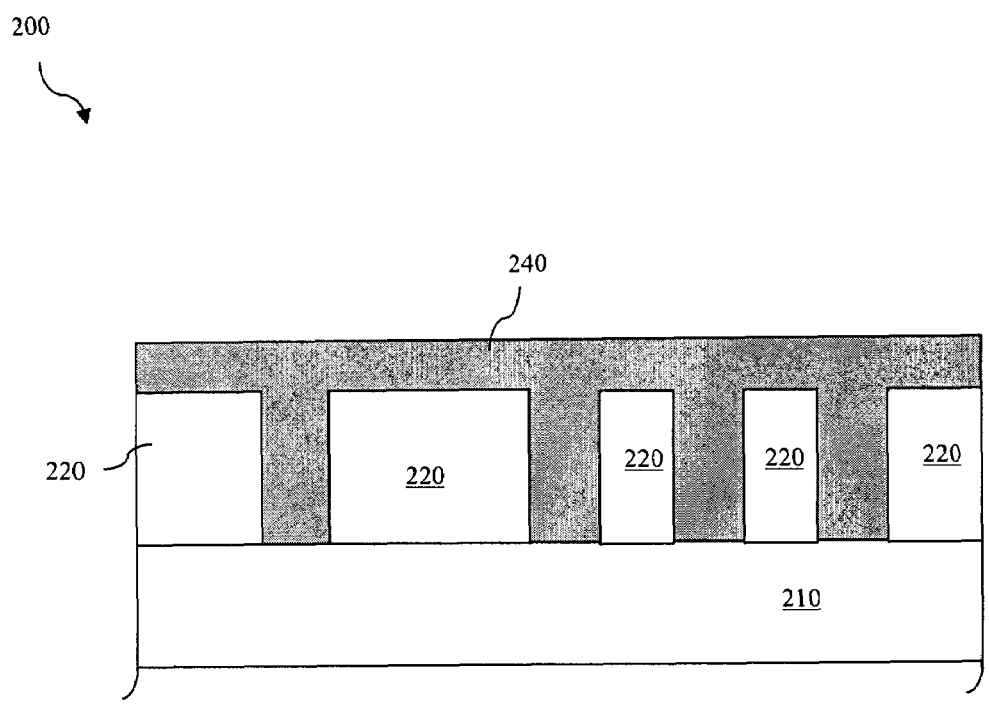

The method 100 proceeds to step 106 by applying a solvent washing process to the under-layer 240 to reduce its thickness, as shown in FIG. 4. A solvent is selected according to the corresponding material of the under-layer such that the under-layer can be properly dissolved in the selected solvent and the thickness of the under-layer 240 can be reduced thereby. In one embodiment, the solvent to dissolve the under-layer includes propylene glycol monomethyl ether (PGME), PGME-acetate (PGMEA), cyclohexanol, or a combination thereof. For example, the solvent may include a PGME/PGMEA volume ratio of about 70/30. The solvent can be applied to the under-layer with proper environmental conditions. For example, the solvent may have a temperature ranging between 25° C. and 120° C. to reduce the thickness of the under-layer. In one example, the under-layer 240 may be reduced to have a thickness from the surface of the dielectric layer 220 to the surface of the under-layer less than about 200 nanometer. Since the solvent washing process is much more efficient and cost-effective compared to the etch-back process, the integrated circuit 200 can achieve a flat surface for photolithography patterning after the formation of the under-layer 240 with a reduced manufacturing cost and an enhanced throughput. Alternatively, if the under-layer 240 is too thin after the solvent washing process, a second under-layer coating process may be applied to the under-layer 240 to increase its thickness according to a predefined criteria. The second under-layer coating process may be substantially similar to the first under-layer coating process in terms of formation and composition. Other proper processes such as baking may be additionally implemented after the second under-layer coating process.

Figure 5:
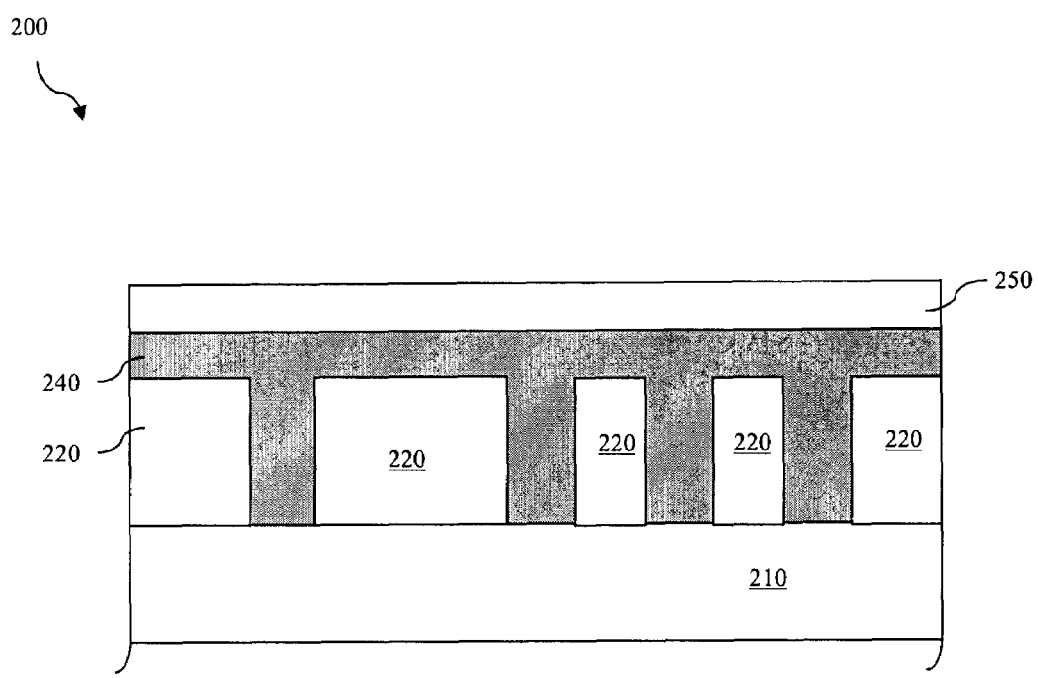

The method 100 proceeds to step 108 by forming a silicon-contained layer 250 on the under-layer 240 as shown in FIG. 5. The silicon-contained layer 250 provides a function as a hard mask for following lithography patterning processes. The silicon-contained layer 250 may have a thickness in a range sufficient to provide an etching mask function, but less than the depth of focus (DOF) for the lithography patterning processes. CD issues associated with DOF can be reduced or even eliminated by selectively implementing the silicon-contained layer 250. In one example, the silicon-contained layer 250 may include a thickness ranging between about 50 nanometers and about 200 nanometers. The silicon-contained layer 250 may include polysilsesquioxane derivative or other silicon contained materials. The silicon-contained layer 250 may be formed by a spin-on coating technique, or other proper methods such as CVD and physical vapor deposition (PVD). The silicon-contained layer 250 may be further baked after the formation thereof on the substrate with a baking temperature ranging between about 160° C. and about 200° C.

Figure 6:
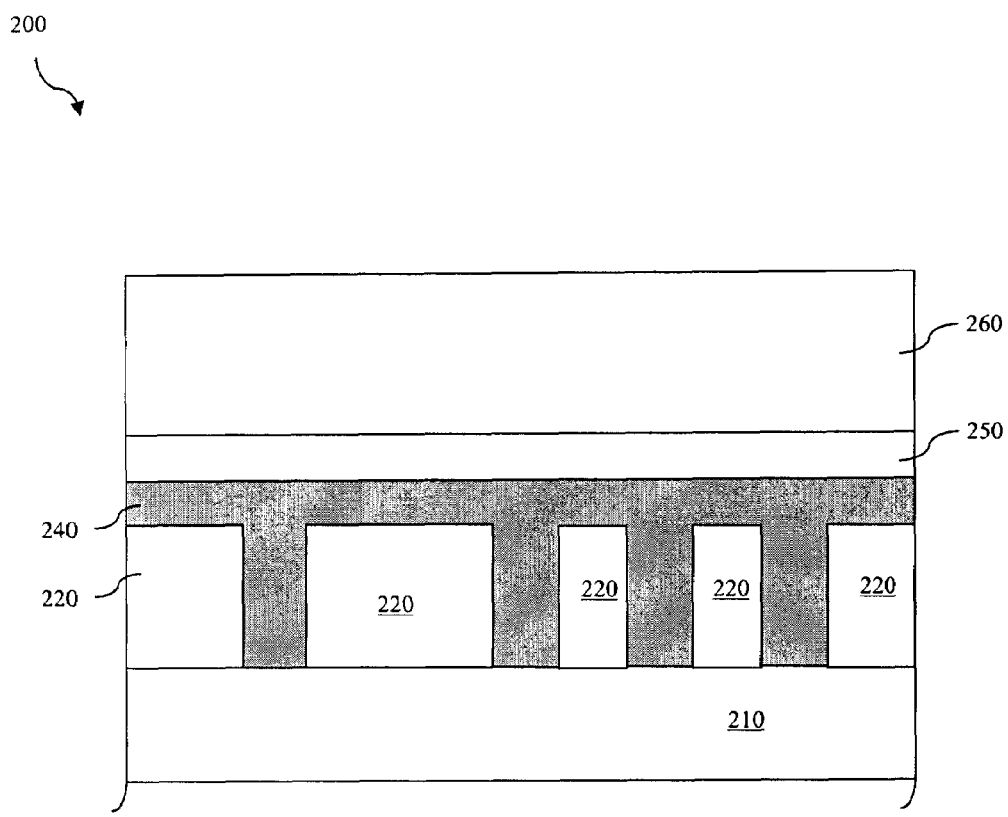

The method 100 proceeds to step 110 by depositing a photoresist (resist) layer 260 on the substrate 210, as shown in FIG. 6. The resist layer 260 is disposed on the substrate 210 and may be adjacent to the silicon-contained layer 250. The resist layer 260 is formed by a method such as spin-on coating in one example. A soft baking may be implemented after the resist layer is formed. The resist layer 260 may include chemical amplification resist (CA resist). The CA resist includes a photosensitive material referred to as photoacid generator (PAG). A photon induces decomposition of PAG and forms a small amount of acid, which further induces a cascade of chemical transformations in the resist layer, typically during a post-exposure bake (PEB) step. The resist layer 260 may have a thickness ranging between about 100 nm and 500 nm.

An adhesion layer (or resist reduced coating) may be formed on the substrate prior to the forming of the resist layer 260. The adhesion layer may act to modify surfaces to enhance adhesion between the substrate and the resist layer. One example of the adhesion layer may include hexamethyldisilazane (HMDS). In another embodiment, an anti-reflection layer (BARC) may be formed on the substrate prior the forming a resist layer. Then another adhesion layer may be formed on the BARC layer. In another embodiment, an adhesion layer and a BARC layer may be combined into one layer to function for both purposes. A baking process may be implemented after forming the adhesion layer (s) and/or BARC layer.

Figure 7:
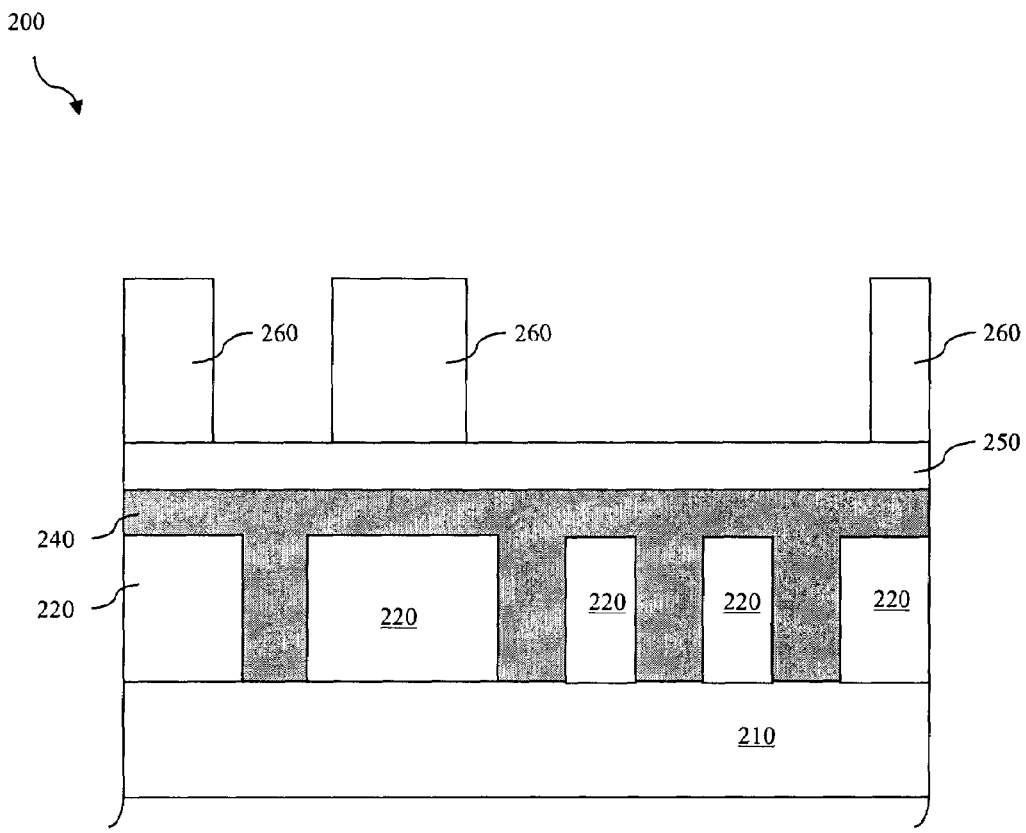

Referring to FIG. 7, the method 100 proceeds to step 112 wherein the resist layer 260 on the substrate 210 is patterned. The patterning can be performed by a lithography process including exposure to a radiation beam. The radiation beam may be a photon beam. For example, the resist layer on a semiconductor wafer may be exposed to an ultraviolet (UV) light through a mask having a predefined pattern. The exposing process may be implemented using a stepper by a step-and-repeat method or using a scanner by a step-and-scan method. Other options to the radiation beam other than photon beams include electron beam and ion beam. For example, the resist layer on a mask may be exposed to an electron beam (e-beam) by an e-beam exposure system (e-beam writer). A pattern may be written to the resist layer according to a predefined pattern using the e-beam writer. The exposing process may be further extended to include other technologies such as a maskless exposing or writing process.

After the exposing process, the resist layer 260 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more openings as illustrated in FIG. 7.

The lithography processes described above may only present a subset of processing steps associated with a lithography patterning technique. The lithography process may further include other steps such as cleaning and baking in a proper sequence. For example, the developed resist layer may be further baked, referred to as hard baking.

Figure 8:
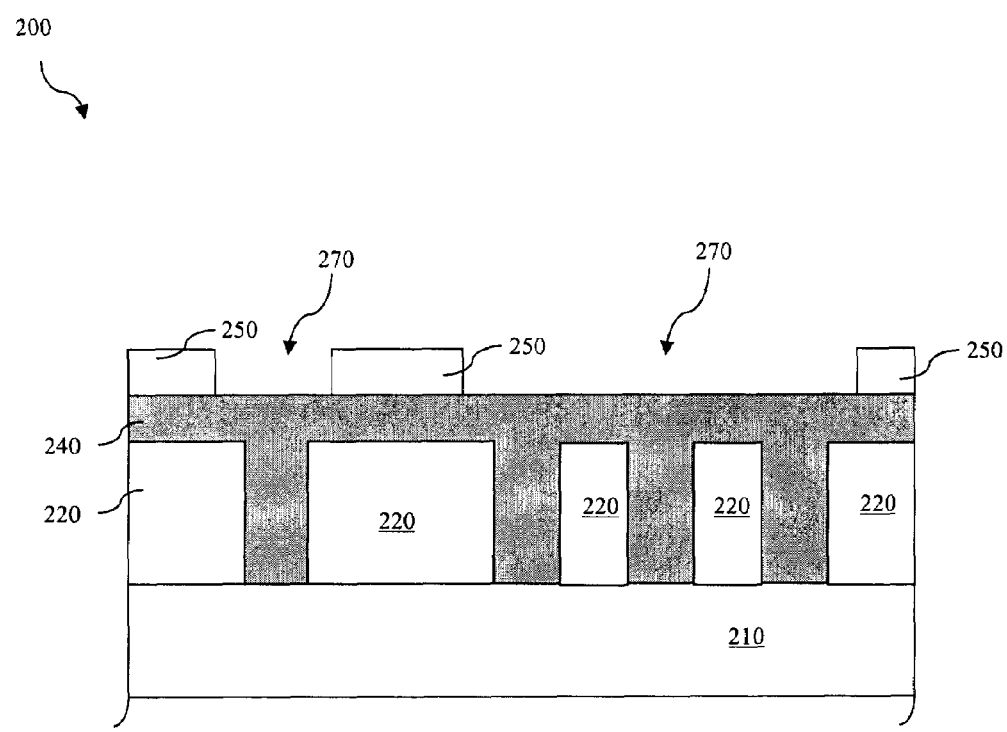

The method 100 proceeds to step 114 wherein the silicon-contained layer 250 is patterned to form a plurality of openings 270 exposing the under-layer 240 there-within, as illustrated in FIG. 8. The silicon-contained layer 250 exposed within the openings of the resist layer 250 may be selectively removed by a technique such as a dry (or plasma) etching process, wherein the exposed silicon-contained material is anisotropically removed. Thereafter, the photoresist layer 260 may be removed by a process such as wet stripping or plasma ashing. Alternatively, the resist may be removed after step 116 wherein the under-layer 240 and dielectric layer 220 are etched within the openings 270 of the silicon-contained layer 250.

Figure 9:
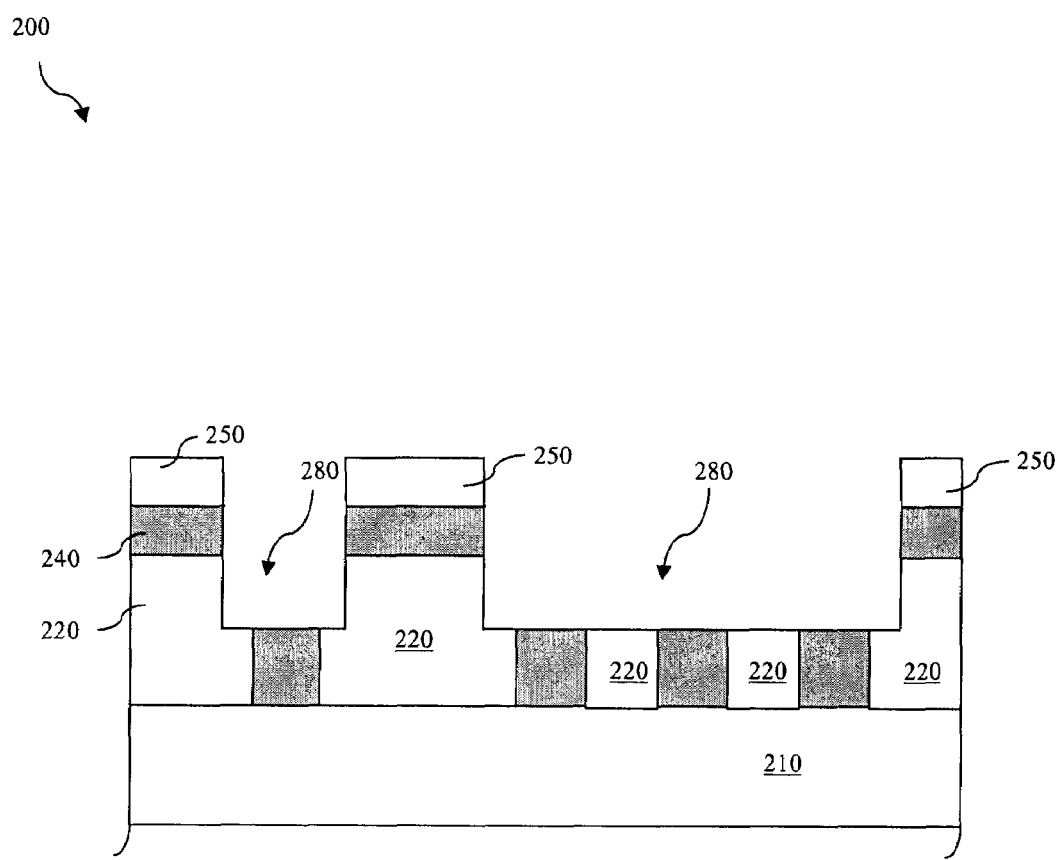

The method 100 proceeds to step 116 wherein the under-layer 240 and dielectric layer 220 are etched back within the openings 270 of the silicon-contained layer 250, to form multiple trenches 280 in the dielectric layer 220, as illustrated in FIG. 9. The trenches 280 may be designed for metal lines and have depths less than that of the trenches 230 designed for vias/contacts. For example, if the trenches 230 are for contacts, then the trenches 280 are designed for metal one. If the trenches 230 are for vias, then the trenches 280 are designed for metal two or other higher metal lines. The process to form the trenches 280 may include an etching process such as dry etching to substantially remove the dielectric layer 220 and the under-layer 240 within the openings 270 utilizing the silicon-contained layer 250 as a hard mask. The etchant employed in forming the trenches 280 may include fluoride contained ions.

Figure 10:
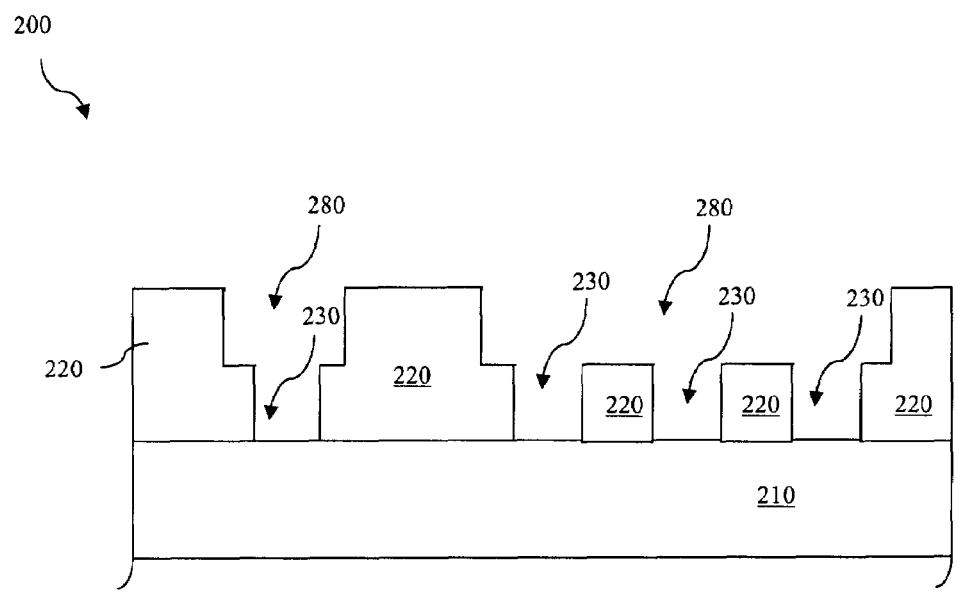

Referring to FIGS. 1 and 10, the method 100 proceeds to step 118 by removing the silicon-contained layer 240. The removal of the silicon-contained layer 250 may utilize another etchant and an etching process selectively removing the silicon-contained layer. The under-layer 240 may be additionally removed by a process such as a solvent washing process substantially similar to the solvent washing process implemented at step 106. The removal of the silicon-contained layer 250 and the under-layer 240 may be combined into one etching process. Other processes such as cleaning may be implemented after the silicon-contained layer 250 and the removals of the under-layer 240.

Thus a dual damascene structure having trenches 230 and trenches 280 are formed utilizing the under-layer, solvent washing process, and/or silicon-contained hard mask layer. The structure and the method masking the same may have variations or other embodiments without departure from the scope of the disclosure. For example, instead of forming the under-layer and reducing the under-layer by a solvent washing process, other materials such as plug fill can be used to fill the trenches 230 and then be etched back. The silicon-contained layer 250 is deposited and patterned thereafter. The trenches 280 are further formed using the silicon-contained layer as a hard mask. The lithography processes implemented in the method 100 may have other variations. For example, an anti-reflective coating (ARC) may be disposed overlying the resist layer, referred to as top ARC (TAR). The trenches 230 may be alternatively disposed in the substrate 210 without additional dielectric layer 220. The resist may be negative type so that the PEB process may decrease the solubility of the exposed resist layer.

Thus, the present disclosure provides a method of dual damascene processing. The method includes providing a substrate having vias formed therein; forming an under-layer in the vias and on the substrate; applying a solvent washing process to the under-layer; forming a silicon contained layer on the under-layer; patterning the silicon contained layer (SCL) to form SCL openings exposing the under-layer within the SCL openings; and etching the substrate and the under-layer within the SCL openings to form trenches.

In the disclosed method, the patterning of the silicon contained layer may include coating a resist layer on the silicon-contained layer; forming resist openings in the resist layer exposing the silicon contained layer within the resist openings, utilizing a lithography process; and etching the silicon contained layer within the resist openings. The method may further include a stripping process to remove the resist layer after the etching of the silicon contained layer. The forming of the under-layer may include utilizing a spin-coating process. The forming of the under-layer may include forming a carbon rich polymer. The forming of the under-layer may include forming a material selected from the group consisting of a novolac polymer, poly(4-hydroxy)styrene (PHS) polymer and acrylic polymer. The forming of the under-layer may include forming the under-layer with a thickness ranging between about 2,000 angstrom and about 10,000 angstrom. The applying of the solvent washing process to the under-layer may include reducing the under-layer to a thickness less than about 2,000 angstrom. The disclosed method may further include applying a baking process to at least one of the under-layer after the forming of the under-layer; and the silicon contained layer after the forming of the silicon contained layer. The method may further include forming a second under-layer after the applying the solvent washing process and before the forming of the silicon contained layer. The etching of the substrate and the under-layer may include utilizing the patterned silicon contained layer as a hard mask. The applying of the solvent washing process may include utilizing a solvent selected from the group consisting of propylene glycol monomethyl ether (PGME), PGME-acetate (PGMEA), cyclohexanol, or a combination thereof. The forming of the silicon contained layer may include utilizing polysilsesquioxane derivative. The forming of the silicon contained layer may include forming the silicon contained layer with a thickness ranging between about 500 angstrom and about 2,000 angstrom. The method may further include after the etching of the substrate and the under-layer, removing the silicon contained layer; and removing the under-layer after the etching of the dielectric material layer and the under-layer.

The present disclosure also provides a method of forming a microelectronic circuit. The method includes providing a substrate having a first trench formed therein; forming an under-layer in the first trench and on the substrate; forming a hard mask layer on the under-layer; patterning the hard mask layer to form an opening exposing the under-layer within the opening; and etching the under-layer and the substrate within the opening to form a second trench.

In the disclosed method, The second trench has a depth less than that of the first trench. The forming of the hard mask layer may include utilizing a silicon contained layer. The method may further include utilizing a solvent washing process to reduce the under-layer before the forming of the hard mask layer.

The present disclosure also provides a method of dual damascene processing. The method includes providing a substrate having a dielectric layer and multiple vias formed therein; forming an under-layer in the multiple vias and on the dielectric layer; applying a solvent washing process to the under-layer to thin the under-layer; forming a silicon contained layer on the under-layer; coating the silicon contained layer with a resist layer; patterning the photoresist layer to form resist openings exposing the SCL within the resist openings; etching the SCL to form SCL openings exposing the under-layer within the SCL openings; and etching the dielectric layer and the under-layer within the SCL openings to form trenches in the dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of dual damascene processing, comprising:
   providing a substrate having vias formed therein;
   forming an under-layer in the vias and on the substrate;
   applying a solvent washing process to the under-layer;
   forming a silicon-contained layer (SCL) on the under-layer;
   patterning the SCL to form SCL openings exposing the under-layer within the SCL openings; and etching the substrate and the under-layer within the SCL openings to form trenches.

2. The method of claim 1, wherein the patterning of the silicon contained layer comprises:
   coating a resist layer on the silicon-contained layer (SCL);
   forming resist openings in the resist layer exposing the silicon contained layer within the resist openings, utilizing a lithography process; and
   etching the silicon contained layer within the resist openings.

3. The method of claim 2, further comprising:
   a stripping process to remove the resist layer after the etching of the silicon contained layer.

4. The method of claim 1, wherein the forming of the under-layer comprising utilizing a spin-coating process.

5. The method of claim 1, wherein the forming of the under-layer comprises forming a carbon rich polymer.

6. The method of claim 1, wherein the forming of the under-layer comprises forming a material selected from the group consisting of a novolac polymer, poly(4-hydroxy)styrene (PHS) polymer and acrylic polymer.

7. The method of claim 1, wherein the forming of the under-layer comprises forming the under-layer with a thickness ranging between about 2,000 angstrom and about 10,000 angstrom.

8. The method of claim 1, wherein the applying of the solvent washing process to the under-layer comprises reducing the under-layer to a thickness less than about 2,000 angstrom.

9. The method of claim 1, further comprising:
   applying a baking process to at least one of: the under-layer after the forming of the under-layer; and the silicon contained layer after the forming of the silicon contained layer.

10. The method of claim 1, further comprises:
    forming a second under-layer after the applying the solvent washing process and before the forming of the silicon contained layer.

11. The method of claim 1, wherein the etching of the substrate and the under-layer comprises utilizing the patterned silicon contained layer as a hard mask.

12. The method of claim 1, wherein the applying of the solvent washing process comprises utilizing a solvent selected from the group consisting of propylene glycol monomethyl ether (PGME), PGME-acetate (PGMEA), cyclohexanol, or a combination thereof.

13. The method of claim 1, wherein the forming of the silicon contained layer comprises utilizing polysilsesquioxane derivative.

14. The method of claim 1, wherein the forming of the silicon contained layer comprises forming the silicon contained layer with a thickness ranging between about 500 angstrom and about 2,000 angstrom.

15. The method of claim 1, further comprising:
    removing the silicon contained layer after the etching of the substrate and the under-layer; and
    removing the under-layer after the etching of the dielectric material layer and the under-layer.

16. A method of forming a microelectronic circuit, comprising:
    providing a substrate having a first trench formed therein;
    forming an under-layer in the first trench and on the substrate;
    forming a hard mask layer on the under-layer;
    patterning the hard mask layer to form an opening exposing the under-layer within the opening; and
    etching the under-layer and the substrate within the opening to form a second trench, wherein the forming of the hard mask layer includes utilizing a silicon contained layer.

17. The method of claim 16, wherein the second trench has a depth less than that of the first trench.

18. The method of claim 16, wherein the forming of the under-layer comprises forming a carbon rich polymer.

19. The method of claim 16, further comprising utilizing a solvent washing process to reduce the under-layer before the forming of the hard mask layer.

20. A method of dual damascene processing, comprising:
    providing a substrate having a dielectric layer and multiple vias formed therein;
    forming an under-layer in the multiple vias and on the dielectric layer;
    applying a solvent washing process to the under-layer to thin the under-layer;
    forming a silicon contained layer on the under-layer;
    coating the silicon contained layer with a resist layer;
    patterning the photoresist layer to form resist openings exposing the SCL within the resist openings;
    etching the SCL to form SCL openings exposing the under-layer within the SCL openings; and
    etching the dielectric layer and the under-layer within the SCL openings to form trenches in the dielectric layer.

* * * * *